United States Patent

Benedetto

[11] Patent Number: 6,121,672
[45] Date of Patent: *Sep. 19, 2000

[54] RAISED PEDESTAL RADIATION SHIELD FOR SENSITIVE ELECTRONICS

[75] Inventor: Joseph M. Benedetto, Monument, Colo.

[73] Assignee: UTMC Microelectronic Systems Inc., Colorado Springs, Colo.

[*] Notice: This patent issued on a continued prosecution application filed under 37 CFR 1.53(d), and is subject to the twenty year patent term provisions of 35 U.S.C. 154(a)(2).

[21] Appl. No.: 09/185,162
[22] Filed: Nov. 3, 1998
[51] Int. Cl.[7] ................................................ H01L 23/552
[52] U.S. Cl. .......................... 257/660; 257/659; 257/730
[58] Field of Search .................................... 257/659, 660, 257/730

[56] References Cited

U.S. PATENT DOCUMENTS

| 5,294,826 | 3/1994 | Marcantonio et al. | 257/659 |
| 5,336,928 | 8/1994 | Neugebauer et al. | |
| 5,406,117 | 4/1995 | Dlugokecki et al. | |
| 5,411,199 | 5/1995 | Suppelsa et al. | |
| 5,635,754 | 6/1997 | Strobel et al. | 257/659 |
| 5,635,756 | 6/1997 | Kohno et al. | |
| 5,825,042 | 10/1998 | Strobel et al. | 250/815.1 |
| 5,872,331 | 2/1999 | Ando et al. | 257/659 |
| 5,998,857 | 12/1999 | Jensen et al. | 257/729 |

*Primary Examiner*—David Hardy
*Attorney, Agent, or Firm*—Morgan & Finnegan, LLP

[57] ABSTRACT

A radiation shield for protecting an integrated circuit device from harmful radiation has a high Z shielding material for absorbing radiation. The radiation shield has a planar lower surface in contact with an upper surface of the integrated circuit device. The radiation shield also has a central portion in substantial registration with integrated circuit device. The central portion has a thickness sufficient to absorb harmful radiation. A distal portion is located about the central portion. A transitional portion is located between and connects the central and distal portions. The transitional portion has a minimum thickness, as, measured from the integrated circuit, that is about equal to the thickness of the central portion.

34 Claims, 1 Drawing Sheet

RAISED PEDESTAL RADIATION SHIELD FOR SENSITIVE ELECTRONICS

TECHNICAL FIELD

The present invention relates, in general, to radiation shielded packages for integrated circuits and more particularly to radiation shielded packages optimized for weight for applications in space.

BACKGROUND ART

There exists, in space, a high level of ionizing radiation caused by the trapping of protons and electrons by the earth's magnetic field. Electrons are present in high earth orbits while electrons and protons are trapped in low and medium earth orbits. The ionizing radiation causes an accumulation of charge in electronic circuits which eventually results in a malfunction or failure of the circuits.

Shielding is a commonly used method for protecting radiation sensitive components. Currently, shielding members for electronics are basically flat slabs of high-Z metal or high-Z/low-Z compounds attached to either the top or top and bottom of an electronics package. Other methods use shielding material that encapsulates the component, providing insulated feed throughs for electronic interconnection. The current methods add significant weight to the electronics. The encapsulation method, although more effective than the current slabs, is more expensive and requires custom design and packaging for the electronics. The added weight poses significant concerns for electronics to be used in space applications. Launch costs for a satellite are approximately $10,000 per pound.

Another method for protecting sensitive electronics is to design a radiation tolerant die that can withstand high levels of ionizing radiation. These design methodologies can involve redundancy of electronic circuits, doping of the semiconductor material, and spacing of electronic circuits. These methodologies are not normally used in commercially available electronics and require increased cost for redesign and production.

Therefore there exists a need to provide an effective radiation shield for sensitive electronic components that is optimized for low weight for space applications.

There also exists a need for an effective radiation shield, optimized for low weight that can be applied to existing electronic components with only minor modification of the packaging.

DISCLOSURE OF INVENTION

It is an object of the present invention to overcome the deficiencies of the prior art and provide an improved radiation shield which is optimized for low weight.

It is a further object of the present invention to provide an effective radiation shield that can be applied to existing commercial electronic components with only minor modification of the external packaging.

According to the present invention, the radiation shield for protecting an integrated circuit from ionizing radiation includes a central portion, or raised pedestal, that is located over the electronic package that houses the integrated circuit. By way of example, for an integrated circuit housed in a ceramic dual inline package, the central portion will have an outline, when viewed from above, which conforms to the outline of the ceramic package. The central portion preferably contains 0.5 to 3 g/cm² of shielding material depending on the application. The central portion has a generally planar lower surface that is attached to the upper surface of the electronic package by an epoxy, solder seal, or other appropriate method.

A second distal portion surrounds the central portion and extends beyond the perimeter of the electronic device to protected. This distal portion provides additional shielding for radiation that would otherwise impinge upon the side of the electronic device without the additional cost associated with providing feed throughs for the electronic interconnects. In the preferred embodiment, the distal portion is approximately one half the thickness of the central portion.

A third transitional portion connects the central and distal portions. The transitional portion has curved upper surface. The surface being located a distance from the lower surface such that the minimum thickness between the upper surface and lower surface of the transitional portion is about equal to the thickness of the central portion, when measured from an edge of the bottom of the electronic package closest the upper surface of the transitional portion.

In an alternate embodiment the third surface is generally planar and has thickness between its upper surface and the lower surface about equal to the thickness of the central portion. The thickness of the transitional portion being measured along a ray extending from an edge of the bottom of the electronic package closest the upper surface. The ray being approximately 135° from the bottom of the electronic package.

In another alternate embodiment radiation shields according to the present invention can be attached to an upper and lower surfaces of the electronics package. In a further embodiment of the present invention the radiation shields according to the present invention may be attached to the electronics package using a solder ring.

The present invention provides an improved radiation shield which is optimized for reduced weight. The present invention further provides an improved radiation shield which can be used in conjunction with commercially available components.

These and other objects, features, and advantages of the present invention will become apparent in light of the following detailed description of a best mode embodiment, accompanying drawings and claims.

BEST MODE FOR CARRYING OUT THE INVENTION

As should be understood, by those skilled in the art, the drawings figures are only schematic representations, and are not intended to portray physical details.

Figure 1:
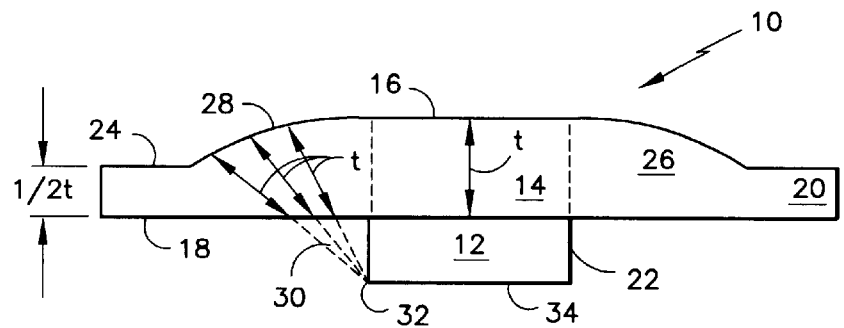
FIG. 1 is a elevational view of a radiation shield having a curved transitional portion.

Referring to FIG. 1, a radiation shield 10 in accordance with the invention is shown. The radiation shield 10 overlies an integrated circuit housed in a dual inline ceramic package 12 (hereinafter IC). A raised central portion 14 having a thickness t is located in substantial registration with the IC 12, or as illustrated in FIG. 2, the raised central portion 14 has the same dimensions as the perimeter of the upper surface of the IC 12 (not shown), located under central portion 14.

The thickness of the raised central portion, as measured between the upper surface 16 of the central portion 14 and lower surface 18 of the radiation shield 10, is determined by the amount of shielding required for the ionizing environment. In high earth orbits, including geosynchronous orbit, 0.5 to 1.5 g/cm$^2$ of shielding material is sufficient. For low to medium earth orbits 2 to 3 g/cm$^2$ of shielding material is required. These loading requirements translate to a tungsten thickness of 0.026 to 0.078 cm for high earth orbits and 0.10 to 0.16 cm for low to medium earth orbits. Kovar or copper/tungsten are preferred shielding materials, however any material providing sufficient shielding properties may be used. The thickness of the material may also vary depending on the level of protection required.

Figure 2:
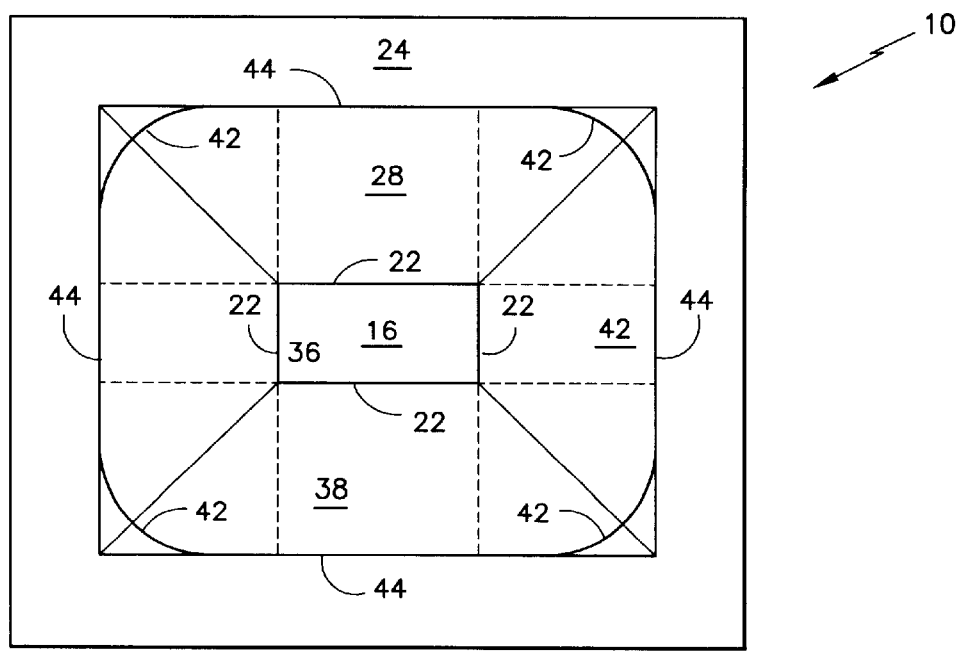
FIG. 2 is a plan view of a radiation shield.

A distal portion 20 is located about the central portion 14 and extends beyond the perimeter of the upper surface of the IC 12, as shown in FIG. 2. The distal portion 20 extends beyond the perimeter of IC 12 to provide shielding for the sides 22 of the IC 12 without the need for the complicated shielding associated with feed throughs for electrical connections. The thickness of the distal portion as measured between a second upper surface 24 and the lower surface 18 is preferably about one half the thickness of the central portion 14. However, the thickness of distal portion 20 may be varied to obtain the desired level of shielding based on the environment and required hardness assurance level of the component.

Located between the central portion 14 and distal portion 20 is a transitional portion 26 which includes a third upper surface 28 which joins upper surface 16 of the central portion 14 and second upper surface 24 of distal portion 20. The transitional portion 26 is designed to have a thickness, as measured from the third upper surface 28 to the lower surface 18, approximately equal to the thickness t of the central portion 14. This thickness allows for adequate shielding for ionizing radiation directed toward the side 22 of the IC 12. The thickness is measured along a plurality of rays 30 projecting from an edge 32 of the bottom surface 34 of IC 12 closest the third upper surface 28. Referring to FIG. 2 the bottom edge of side 36 of IC 12 would be used in determining the location of a first portion 38 of third upper surface 28 and likewise the bottom edge of side 32 would be used in determining the location of second portion 42 of third upper surface 28. The transitional portion 26 designed in accordance with this method would have rounded corners 42 as shown in FIG. 2. For ease of manufacture the portions 44 of the third upper surface parallel to the sides 22 of IC 12 could be extended so that they intersect thus eliminating the rounded corners 42.

Figure 3:
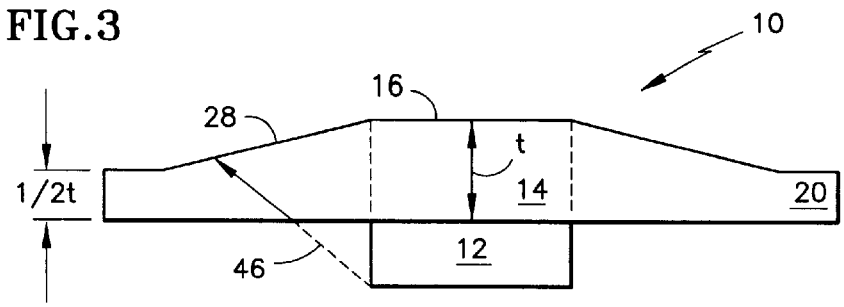
FIG. 3 is an elevational view of a radiation shield having a planar transitional portion.

FIG. 3 illustrates a third embodiment of the subject invention wherein the third upper surface 28 is planar as opposed to curved. The transitional portion 26 has a thickness t equal to the thickness of the central portion 14. The thickness is measured between the third upper surface 28 and the lower surface 18. The thickness is measured along a ray 46 projecting from the edge 32 of the bottom 34, as in the previous embodiment the corners 42 may either be rounded to reduce weight, or angled for ease of manufacture.

The shield 10 is made of a high Z material, preferably Kovar or a copper/tungsten alloy. The shield may also be of a combination of high Z and low Z materials. The shield 10 may also be applied to multiple sides of the IC 12 or other electronic package. The shield 10 preferred method of attaching the shield 10 to the IC 12 is by an epoxy such as ABLEBOND or by a solder ring although other methods may be used such as a clamp or screw.

While the particular invention has been described with reference to illustrative embodiments, this description is not meant to be construed in a limiting sense. It is understood that, various modifications of the illustrative embodiments, such as using multiple shields, or using a shield according to the present invention in combination with non-shielding materials such as ceramic or glass, as well as additional embodiments of the invention, will be apparent to persons skilled in the art upon reference to this description without departing from the spirit of the invention, as recited in the claims appended hereto. Thus, upon understanding the present invention, one of ordinary skill in the art could employ the present invention in a variety of application requiring radiation shielding. It is therefore contemplated that the appended claims will cover any such modifications or embodiments as within the true scope of the invention.

What is claimed is:

1. A radiation shield for an integrated circuit device to protect said device from damage caused by ionizing radiation, said integrated circuit device including a first surface being generally planar and a second surface being generally planar and opposing the first surface, said radiation shield comprising:

a shielding material for absorbing ionizing radiation;

a lower surface being generally planar and in contact with the first surface;

a central portion positioned in substantial registration with the first surface, said central portion including a first upper surface and having a first thickness as measured from said first upper surface to said lower surface;

a distal portion located about said central portion, said distal portion including a second upper surface and having a second thickness as measured from said second upper surface to said lower surface, wherein said second thickness is less than said first thickness; and, a transitional portion including a third upper surface forming a continuation of said first and second upper surfaces, said third upper surface positioned relative the integrated circuit device such that a minimum thickness between said third upper surface and said lower surface is about equal to said first thickness, as measured from an edge of said second surface, closest said third upper surface.

2. The radiation shield of claim 1 wherein said shielding material comprises a high Z material.

3. The radiation shield of claim 1 wherein said shielding material comprises kovar.

4. The radiation shield of claim 1 wherein said shielding material comprises a copper tungsten alloy.

5. The radiation shield of claim 1 wherein said first upper surface is attached to the first surface by an epoxy.

6. The radiation shield of claim 1 wherein said first upper surface is attached to the first surface by a solder ring.

7. The radiation shield of claim 1 wherein the central portion comprises approximately 0.5 to 3 g/CM$^2$ of said shielding material.

8. The radiation shield of claim 1 wherein said second surface of said integrated circuit device includes a first edge and a second edge, said first edge and said second edge terminate at a common point, and said third upper surface comprises:

a first portion positioned relative the integrated circuit device such that a minimum thickness between said first portion and said lower surface is about equal to said first thickness, as measured from said first edge of said second surface, and wherein said first portion is parallel to said first edge;

a second portion positioned relative to the integrated circuit device such that a minimum thickness between said second portion and said lower surface is about equal to said first thickness, as measured from said second edge of said second surface, any wherein said second portion is parallel to said first edge; and a corner portion formed by extending said first portion and said second portion to a common intersection.

9. A radiation shield for an integrated circuit device to protect said device from damage caused by ionizing radiation, said integrated circuit device including a first surface being generally planar and a second surface being generally planar and opposing the first surface, said radiation shield comprising:

a shielding material for absorbing ionizing radiation;
a lower surface being generally planar and in contact with the first surface;
a central portion positioned in substantial registration with the first surface, said central portion including a first upper surface and having a first thickness as measured from said first upper surface to said lower surface;
a distal portion located about said central portion, said distal portion including a second upper surface and having a second thickness as measured from said second upper surface to said lower surface, wherein said second thickness is less than said first thickness; and,
a transitional portion including a third upper surface forming a continuation of said first and second upper surfaces, said third upper surface positioned relative to the integrated circuit device such that a minimum thickness between said third upper surface and said lower surface is about equal to said first thickness, as measured along a line having an end located at an edge of said second surface, closest said third upper surface, said line forming a 135° angle with the lower surface.

10. The radiation shield of claim 9 wherein said shielding material comprises a high Z material.

11. The radiation shield of claim 9 wherein said shielding material comprises kovar.

12. The radiation Shield of claim 9 wherein said shielding material comprises a copper tungsten alloy.

13. The radiation shield of claim 9 wherein said first upper surface is attached to the first surface by an epoxy.

14. The radiation shield of claim 9 wherein said first upper surface is attached to the first surface by a solder ring.

15. The radiation shield of claim 9 wherein said central portion comprises approximately 0.5 to 3 g/CM$^2$ of said shielding material.

16. The radiation shield of claim 9 wherein said second surface of said integrated circuit device includes a first edge and a second edge, said first edge and said second edge terminate at a common point, and said third upper surface comprises:

a first portion positioned relative to the integrated circuit device such that a minimum thickness between said first portion and said lower surface is about equal to said first thickness, as measured from said first edge of said second surface, and wherein said first portion is parallel to said first edge;
a second portion positioned relative to the integrated circuit device such that a minimum thickness between said second portion and said lower surface is about equal to said first thickness, as measured from said second edge of said second surface, and wherein said second portion is parallel to said first edge; and
a corner portion formed by extending said first portion and said second portion to a common intersection.

17. A radiation hardened integrated circuit device including an integrated circuit device including a first surface being generally planar and a second surface being generally planar and opposing the first surface, said radiation hardened integrated circuit device comprising:

a first radiation shield disposed on the first surface, said first radiation shield comprising:
a shielding material for absorbing ionizing radiation;
a lower surface being generally planar and in contact with the first surface;
a central portion positioned in substantial registration with the first surface, said central portion including a first upper surface and having a first thickness as measured from said first upper surface to said lower surface;
a distal portion located about said central portion, said distal portion including a second upper surface and having a second thickness as measured from said second upper surface to said lower surface, wherein said second thickness is less than said first thickness; and,
a transitional portion including a third upper surface forming a continuation of said first and second upper surfaces, said third upper surface positioned relative to the integrated circuit device such that a minimum thickness between said third upper surface and said lower surface is about equal to said first thickness, as measured from an edge of said second surface closest said third upper surface; and, a second radiation shield disposed on the second surface, said second radiation shield comprising:
a second shielding material for absorbing ionizing radiation;
a second lower surface being generally planar and in contact with the second surface;
a second central portion positioned in substantial registration with the second surface, said second central portion including a fourth upper surface and having a third thickness as measured from said fourth upper surface to said second lower surface;
a second distal portion located about said second central portion, said second distal portion including a fifth upper surface and having a fourth thickness as measured from said fifth upper surface to said second lower surface, wherein said fourth thickness is less than said third thickness; and,
a transitional portion including a sixth upper surface forming a continuation of said fourth and fifth upper surfaces, said sixth upper surface positioned relative to the integrated circuit device such that a second minimum thickness between said sixth upper surface and said second lower surface is about equal to said third thickness, as measured from an edge of said first surface closest said sixth upper surface.

18. The radiation hardened integrated circuit device of claim 17 wherein said shielding material comprises a high Z material.

19. The radiation hardened integrated circuit device of claim 18 wherein said second shielding material and said shielding material comprise a same material.

20. The radiation hardened integrated circuit device of claim 19 wherein said central portion and said second central portion each comprise approximately 0.5 to 3 g/CM$^2$ of said same shielding material.

21. The radiation shield of claim 18 wherein said same shielding material comprises kovar.

22. The radiation shield of claim 20 wherein said same shielding material comprises a copper tungsten alloy.

23. The radiation hardened integrated circuit device of claim 21 wherein said first upper surface is attached to the first surface by an epoxy and said second upper surface is attached to the second surface by said epoxy.

24. The radiation hardened integrated circuit device of claim 22 wherein said first upper surface is attached to the first surface by a solder ring and said second lower surface is attached to the second surface by a second solder ring.

25. The radiation shield of claim 24 wherein said second surface of said integrated circuit device includes a first edge and a second edge, said first edge and said second edge terminate at a common point, and said third upper surface comprises:
   a first portion positioned relative to the integrated circuit device such that a minimum thickness between said first portion and said lower surface is about equal to said first thickness, as measured from said first edge of said second surface, and wherein said first portion is parallel to said first edge;
   a second portion positioned relative to the integrated circuit device such that a minimum thickness between said second portion and said lower surface is about equal to said first thickness, as measured from said second edge of said second surface, and wherein said second portion is parallel to said first edge; and a corner portion formed by extending said first portion and said second portion to a common intersection.

26. The radiation shield of claim 17 wherein said second surface of said integrated circuit device includes a first edge and a second edge, said first edge and said second edge terminate at a common point, and said third upper surface comprises:
   a first portion positioned relative to the integrated circuit device such that a minimum thickness between said first portion and said lower surface is about equal to said first thickness, as measured from said first edge of said second surface, and wherein said first portion is parallel to said first edge;
   a second portion positioned relative to the integrated circuit device such that a minimum thickness between said second portion and said lower surface is about equal to said first thickness, as measured from said second edge of said second surface, and wherein said second portion is parallel to said first edge; and
   a corner portion formed by extending said first portion and said second portion to a common intersection.

27. A radiation hardened integrated circuit device including an integrated circuit device including a first surface being generally planar and a second surface being generally planar and opposing the first surface, said radiation hardened integrated circuit device comprising:
   a first radiation shield disposed on the first surface, said first radiation shield comprising:
      a shielding material for absorbing ionizing radiation;
      a lower surface being generally planar and in contact with the first surface;
      a central portion positioned in substantial registration with the first surface, said central portion including a first upper surface and having a first thickness as measured from said first upper surface to said lower surface;
      a distal portion located about said central portion, said distal portion including a second upper surface and having a second thickness as measured from said second upper surface to said lower surface, wherein said second thickness is less than said first thickness; and,
      a transitional portion including a third upper surface forming a continuation of said first and second upper surfaces, said third upper surface positioned relative to the integrated circuit device such that a minimum thickness between said third upper surface and said lower surface is about equal to said first thickness, as measured along a line having an end located at an edge of said second surface, closest said third upper surface, said line forming a 135° angle with the lower surface; and,
   a second radiation shield disposed on the second surface, said second radiation shield comprising:
      a second shielding material for absorbing ionizing radiation;
      a second lower surface being generally planar and in contact with the second surface;
      a second central portion positioned in substantial registration with the second surface, said second central portion including a fourth upper surface and having a third thickness as measured from said fourth upper surface to said second lower surface;
      a second distal portion located about said second central portion, said second distal portion including a fifth upper surface and having a fourth thickness as measured from said fifth upper surface to said second lower surface, wherein said fourth thickness is less than said third thickness; and,
      a transitional portion including a sixth upper surface forming a continuation of said fourth and fifth upper surfaces, said sixth upper surface positioned relative to the integrated circuit device such that a minimum thickness between said sixth upper surface and said second lower surface is about equal to said third thickness, as measured along a line having an end located at an edge of said second surface, closest said sixth upper surface, said line forming a 135° angle with said second lower surface.

28. The radiation hardened integrated circuit device of claim 27 wherein said shielding material comprises a high Z material.

29. The radiation hardened integrated circuit device of claim 28 wherein said second shielding material and said shielding material comprise a same material.

30. The radiation hardened integrated circuit device of claim 28 wherein said same shielding material comprises kovar.

31. The radiation hardened integrated circuit device of claim 29 wherein said same shielding material comprises a copper tungsten alloy.

32. The radiation hardened integrated circuit device of claim 30 wherein said first upper surface is attached to the first surface by an epoxy and said second upper surface is attached to the second surface by said epoxy.

33. The radiation hardened integrated circuit device of claim 32 wherein said first upper surface is attached to the first surface by a solder ring and said second lower surface is attached to the second surface by a second solder ring.

34. The radiation hardened integrated circuit device of claim 28 wherein the central portion and the second central portion each comprise approximately 0.5 to 3 g/CM$^2$ of said same shielding material.

* * * * *